United States Patent

Takahashi

[11] Patent Number: 5,917,522
[45] Date of Patent: *Jun. 29, 1999

[54] SHEARING MADE INK EJECTING APPARATUS WITH RELIABLE EJECTION OVER A RANGE OF TEMPERATURES

[75] Inventor: Yoshikazu Takahashi, Nagoya, Japan

[73] Assignee: Brother Kogyo Kabushiki Kaisha, Nagoya, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/638,563

[22] Filed: Apr. 26, 1996

[30] Foreign Application Priority Data

Aug. 9, 1995 [JP] Japan ...................... 7-203181

[51] Int. Cl.$^6$ .............. B41J 2/045; H01L 41/04
[52] U.S. Cl. ............... 347/71; 347/69; 310/346; 310/358
[58] Field of Search .............. 347/68–72, 14; 310/346, 358

[56] References Cited

U.S. PATENT DOCUMENTS

| | | | |
|---|---|---|---|
| 3,946,398 | 3/1976 | Kyser et al. | 347/70 |
| 4,311,980 | 1/1982 | Prudenziati | 338/4 |
| 4,723,129 | 2/1988 | Endo et al. | 347/56 |
| 4,879,568 | 11/1989 | Bartky et al. | 347/69 |

OTHER PUBLICATIONS

Piezoelectric Products, Sumitomo Metal Industries, Ltd., No. 73910, 1997.

Piezoelectric Ceramics, Tokin, vol. 2, Cat. No. VR–07JE, Jun. 20, 1997.

*Primary Examiner*—Benjamin R. Fuller
*Assistant Examiner*—C. Dickens
*Attorney, Agent, or Firm*—Oliff & Berridge, PLC

[57] ABSTRACT

A material used for the actuator walls in an ink ejecting device, that are the walls of ink flow paths, are those in which the rate of change of the electromechanical coupling coefficient, with changes in temperature, is not greater than 3000 PPm/° C. at temperatures of 20° C. or less. Consequently, at a driving voltage that produces an ink drop ejection velocity of 5 m/s at 25° C., the ink drop ejection velocity when driven at 10° C. is at least 3 m/s, so that it is possible to obtain good printing quality.

4 Claims, 4 Drawing Sheets

| RATE OF CHANGE OF THE ELECTROMECHANICAL COUPLING CO-EFFICIENT WITH CHANGES IN TEMPERATURE (PPm/°C) | EJECTION VELOCITY AT 25°C (m/s) | EJECTION VELOCITY AT 10°C (m/s) |
|---|---|---|
| 5100 | 5.0 | X |
| 3950 | 5.0 | X |
| 3480 | 5.0 | 2.5 |
| 2980 | 5.0 | 3.1 |
| 2630 | 5.0 | 3.3 |
| 1910 | 5.0 | 3.5 |
| 950 | 5.0 | 3.9 |
| 350 | 5.0 | 4.4 |
| -1120 | 5.0 | 4.8 |
| -2150 | 5.0 | 4.9 |

X EJECTION WAS IMPOSSIBLE

Fig. 1

| RATE OF CHANGE OF THE ELECTROMECHANICAL COUPLING CO-EFFICIENT WITH CHANGES IN TEMPERATURE (PPm/°C) | EJECTION VELOCITY AT 25°C (m/s) | EJECTION VELOCITY AT 10°C (m/s) |
|---|---|---|
| 5100 | 5.0 | × |
| 3950 | 5.0 | × |
| 3480 | 5.0 | 2.5 |
| 2980 | 5.0 | 3.1 |
| 2630 | 5.0 | 3.3 |
| 1910 | 5.0 | 3.5 |
| 950 | 5.0 | 3.9 |
| 350 | 5.0 | 4.4 |
| -1120 | 5.0 | 4.8 |
| -2150 | 5.0 | 4.9 |

× EJECTION WAS IMPOSSIBLE

SHEARING MADE INK EJECTING APPARATUS WITH RELIABLE EJECTION OVER A RANGE OF TEMPERATURES

BACKGROUND OF THE INVENTION

1. Field of the Invention

The invention relates to an ink ejecting apparatus.

2. Description of Related Art

Today, among the non-impact printing apparatuses which are greatly expanding into the market by replacing impact type printing apparatuses, ink jet-type printing apparatuses can be cited as the simplest in theory and the easiest in terms of adding multiple gradations and color. Among these, drop-on-demand type printers that eject only ink drops used in printing are rapidly spreading because these devices have good ejection efficiency and low running costs.

As representative methods of drop-on-demand type devices, the Kyser type, disclosed in U.S. Pat. No. 3,946,398, and the thermal jet type, disclosed in U.S. Pat. No. 4,723,129, can be cited. Of these, the former is difficult to reduce in size, while the latter requires that the ink be heat-resistant since intense heat is applied to the ink. Thus each type presents an extremely difficult problem.

A new method, which simultaneously resolves the above-described defects, is the shearing mode type which uses piezoelectric ceramics and is disclosed in U.S. Pat. No. 4,879,568.

As shown in FIG. 2A, the aforementioned shearing mode type ink jet apparatus 600 is composed of a bottom wall 601, a top wall 602 and shearing mode actuator walls 603 between the bottom and top walls 601,602. These actuator walls 603 are composed of lower walls 607, which are bonded to the bottom wall 601 and are polarized in the direction indicated by arrows 611. The upper walls 605, which are bonded to the top wall 602, are polarized in the direction indicated by arrows 609. The actuator walls 603 come in pairs, and an ink flow path 613 is formed therebetween, while a space 615, narrower than the ink flow path 613, is formed between the next pair of actuator walls 603.

A nozzle plate 617 (FIG. 2B), having a nozzle 618 for each ink flow path 613 is fixed to one end of the ink flow paths 613, and electrodes 619,621 are provided as a metal layer on both side surfaces of each actuator wall 603. In addition, at the other end of each ink flow path 613, from the nozzles 618, there is a common ink chamber 626, and a manifold member 628, having filler units 627 in order to prevent the ink in the common ink chamber 626 from entering the above-described space 615, is also attached.

Each electrode 619,621 is coated with an insulation layer (not shown) in order to insulate the electrodes from the ink. Furthermore, the electrodes 619, which face the spaces 615, are connected to a ground 623, while the electrodes 621, provided in the ink flow paths 613, are connected to a silicon chip 625 which gives an actuator driving signal.

Next, the method of producing the ink jet apparatus 600 will be described. First, a piezoelectric ceramic layer which is polarized in the direction of arrow 611 is bonded to the bottom wall 601, and a piezoelectric ceramic layer which is polarized in the direction of arrow 609 is bonded to the top wall 602. The thickness of each piezoelectric ceramic layer is equal to the heights of the lower wall 607 and the upper wall 605. Next, parallel grooves are formed in the piezoelectric ceramic layers through the rotation of a diamond cutting disc, or the like, to form the lower walls 607 and upper walls 605. A metal layer is then formed on the side surfaces of the lower walls 607 through vacuum evaporation and the insulating layer is provided on top of the metal layer. Similarly, a metal layer and the insulating layer are provided on the side surfaces of the upper walls 605.

The top part of the upper walls 605 and the top part of the lower walls 607 are bound together, forming the ink flow paths 613 and the spaces 615. Next, a nozzle plate 617, in which nozzles 618 are formed, is attached to one end of the ink flow paths 613 and the spaces 615 so that the nozzles 618 correspond to the ink flow paths 613. Further, a manifold member 628, in which fillers 627 and a common ink chamber 626 are formed, is attached to the other end of the ink flow paths 613 and empty spaces 615 so that the fillers 627 correspond to the spaces 615. Additionally, the electrodes, at the mainfold member and of the ink flow paths 613 and the spaces 615, are connected to the silicon chip 625 and the ground 623 respectively.

In addition, each actuator wall 603 is capable of undergoing a piezoelectric thickness deformation in the direction which increases the volume of the ink flow paths 613, through the silicon chip 625 impressing a voltage on the electrode 621 of the ink flow path 613. For example, as shown in FIG. 3, when the voltage V is impressed on the ink flow path 613C, an electric field is created in actuator wall 603E in the direction of arrows 629,631 and in wall 603F in the direction of arrows 630,632, so that actuator walls 603E and 603F undergo a piezoelectric thickness deformation in the direction which increases the volume of the ink flow path 613C. At this time, the pressure inside the ink flow path 613C, including that near the nozzle 618, decreases. This condition is maintained for the one-way traversing time T of a pressure wave in the ink flow path 613. When this occurs, ink is supplied from the common ink chamber 626 during this interval.

The aforementioned T is the time needed for the pressure wave in the ink flow path 613 to traverse the longitudinal direction of the ink flow path 613, and is determined by the length L of the ink flow path 613 and the speed of sound "a" in the ink that is inside the ink flow path 613, that is T=L/a.

According to pressure wave propagation theory, when precisely the time T has elapsed from the impressing of the aforementioned voltage, the pressure inside the ink flow path 613 reverses and switches to a positive pressure, but in accordance with this timing, the voltage impressed on the electrode 621C of the ink flow path 613C is returned to 0. When this occurs, the actuator walls 603E,603F return to the state prior to deformation (FIG. 2A), and a pressure is applied to the ink. At this time, the pressure of the pressure wave, which has turned positive and the pressure created by the actuator walls 603E,603F returning to the pre-deformation state add together, so that a relatively high pressure is created in the area near the nozzle 618C of the ink flow path 613C, causing ink to be ejected from the nozzle 618C.

However, the ink used in this kind of ejection apparatus is such that, as shown in FIG. 4, the properties change by an extremely large amount according to the surrounding temperature with, for example one particular ink having a viscosity of around 3 mPa·s at 25° C., but having over 6 mPa·s at 10° C. or less, and around 2 mPa·s at 40° C. In addition, the rate of change of the electromechanical coupling coefficient of the electromechanical energy conversion device used in this kind of ejection apparatus, with changes in the temperature, is on the order of 3500 to 8000 PPm/° C. The rate of change is particularly large at temperatures of 20° C. or less.

Because of the change in the viscosity of the ink and the changes in the electromechanical coupling coefficient of the electromechanical energy conversion device caused by changes in temperature, the ink drop ejection velocity becomes smaller at low temperatures. In the worst cases, ejection becomes impossible, creating the problem that printing quality drops.

In order to resolve this problem, the ink drop ejection velocity has been adjusted by causing the driving voltage of the ink ejection device to change in accordance with a change in the temperature around the ink ejection apparatus. However, this requires a temperature sensor and voltage conversion sensor circuit as part of the driving circuit, creating the problem that the cost of the driving circuit increases.

SUMMARY OF THE INVENTION

In consideration of the foregoing, it is an object of the invention to provide an ink ejection apparatus in which the printing quality does not fall because of changes in the temperature, without requiring a temperature sensor or voltage conversion circuit.

In order to achieve the above and other objects, the invention is an ink ejection apparatus which ejects ink inside the ink flow path from an ejection opening that communicates to the ink flow path by using an electromechanical energy conversion device to cause the volume of the ink flow path to change, wherein the rate of change of the electromechanical coupling coefficient of the electromechanical energy conversion device with changes in temperature, at temperatures of 20° C. or less, is not greater than 3000 PPm/°C. Thus, drops in the electromechanical coupling coefficient of the electromechanical energy conversion device, at low temperatures, are suppressed so that drops in the ink ejection velocity at low temperatures are suppressed.

As is clear from the above explanation, with the ink ejecting apparatus of the invention, the rate of change of the electromechanical coupling coefficient of the electromechanical energy conversion device with changes in temperature, at temperatures of 20° C. or less, is not greater than 3000 PPm/°C. Consequently, it is possible to suppress drops in the electromechanical coupling coefficient of the electromechanical energy conversion device at low temperatures so that it is possible to suppress drops in the ink ejection velocity at the low temperatures. Accordingly, it is possible to obtain good printing quality regardless of changes in the temperature without using a temperature sensor and a voltage conversion circuit which were conventionally required. In addition, because the temperature sensor and voltage conversion circuit are not necessary, it is possible to reduce the cost of the apparatus.

BRIEF DESCRIPTION OF THE DRAWINGS

A preferred embodiment of the invention will be described in detail with reference to the following figures, wherein:

FIG. 1 shows the results of an experiment in which the temperature and the rate of change of the electromechanical coupling coefficient of the piezoelectric material comprising the ink ejection apparatus of the present embodiment were caused to change;

DETAILED DESCRIPTION OF THE PREFERRED EMBODIMENT

A preferred embodiment of the invention will be described in detail with reference to the figures.

Figure 2A:
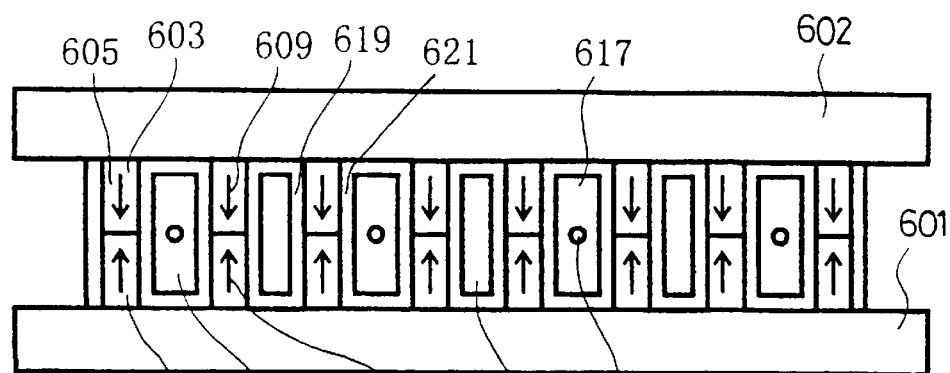
FIG. 2A shows the structure of an ink ejection apparatus of a conventional example and the invention.
Figure 2B:
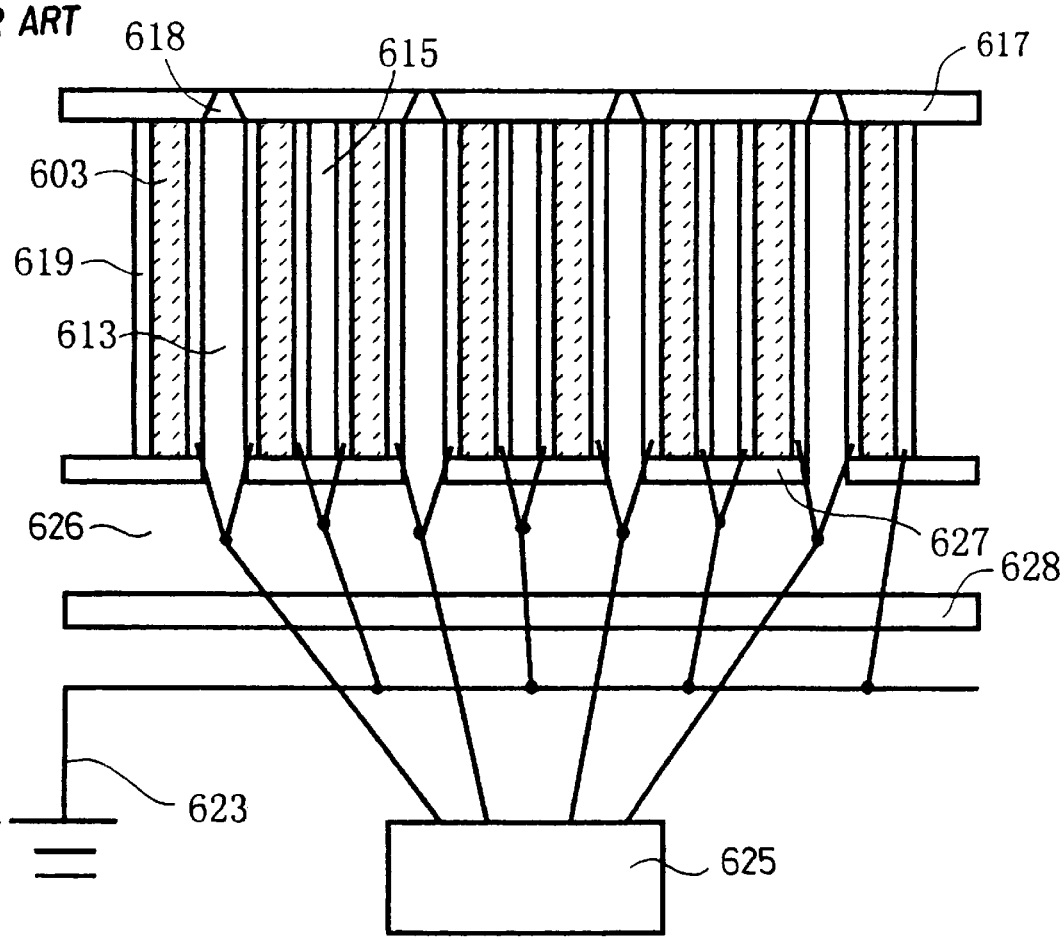
FIG. 2B is a plan, partially cut away view of the ink ejection apparatus of a conventional example and the invention.

The ink ejection device of the present embodiment comprises, similar to the conventional ink ejecting apparatus 600 shown in FIGS. 2A and 2B, a bottom wall 601, a top wall 602 and shearing mode actuator walls 603 between the bottom and top walls 601,602. As the material which comprises these actuator walls, materials were prepared in which the rate of change in the electromechanical coupling coefficient thereof, with changes in temperature, is −2150 to 2980 PPm/°C. at temperatures of 20° or less. For purposes of comparison, conventionally used materials were also prepared in which the rate of change in the electromechanical coupling coefficient thereof, with changes in temperature, is 3480 to 5100 PPm/° C. at temperatures of 20°or less.

The rate of change of the electromechanical coupling coefficient with changes in temperature is found using the following formula:

$$(1/\Delta t) \cdot (k(t_1) - k(t_2))/k_{20} \times 10^6 \text{ (PPm/°C.)},$$

where k is the electromechanical coupling coefficient, $k(t_1)$ is k at temperature $t_1$, $k(t_2)$ is k at temperature $t_2$, $k_{20}$ is k at the temperature 20° C., and $\Delta t = t_2 - t_1$ (°C.).

The actuator walls 603 are composed of lower walls 607 which are bonded to the bottom wall 601 and are polarized in the direction indicated by arrows 611, and upper walls 605 which are bonded to the top wall 602 and are polarized in the direction indicated by arrows 609.

The actuator walls 600 are made of a piezoelectric material such as lead zirconate tilanate (PZT) and comprise an electromechanical energy conversion device as they deflect to change the volume of chambers they define upon the application of an electric current.

The actuator walls 603 come in pairs, and an ink flow path 613 is formed therebetween. A space 615, more narrow than the ink flow path 613, is formed with the next pair of actuator walls 603 i.e., one of the actuator walls of the flow path 613 and the adjacent wall of the adjacent flow path 613.

A nozzle plate 617, having a nozzle 618 for each flow path 613, is fixed to one end of the ink flow paths 613. Electrodes 619 and 621 are provided, as a metal layer, on both side surfaces of each actuator wall 603. In addition, attached at the other end of each ink flow path 613, from the nozzle plate 617, there is a common ink chamber 626, and a manifold member 628 having filler units 627 in order to prevent the ink in the common ink chamber 626 from entering the above-described spaces 615.

Each electrode 619,621 is coated with an insulation layer (not shown) in order to insulate the electrodes from the ink. Further, the electrodes 619 which face the spaces 615 are connected to a ground 623, while the electrodes 621 provided in the ink flow paths 613 are connected to a silicon chip 625 which gives an actuator driving signal.

Figure 4:
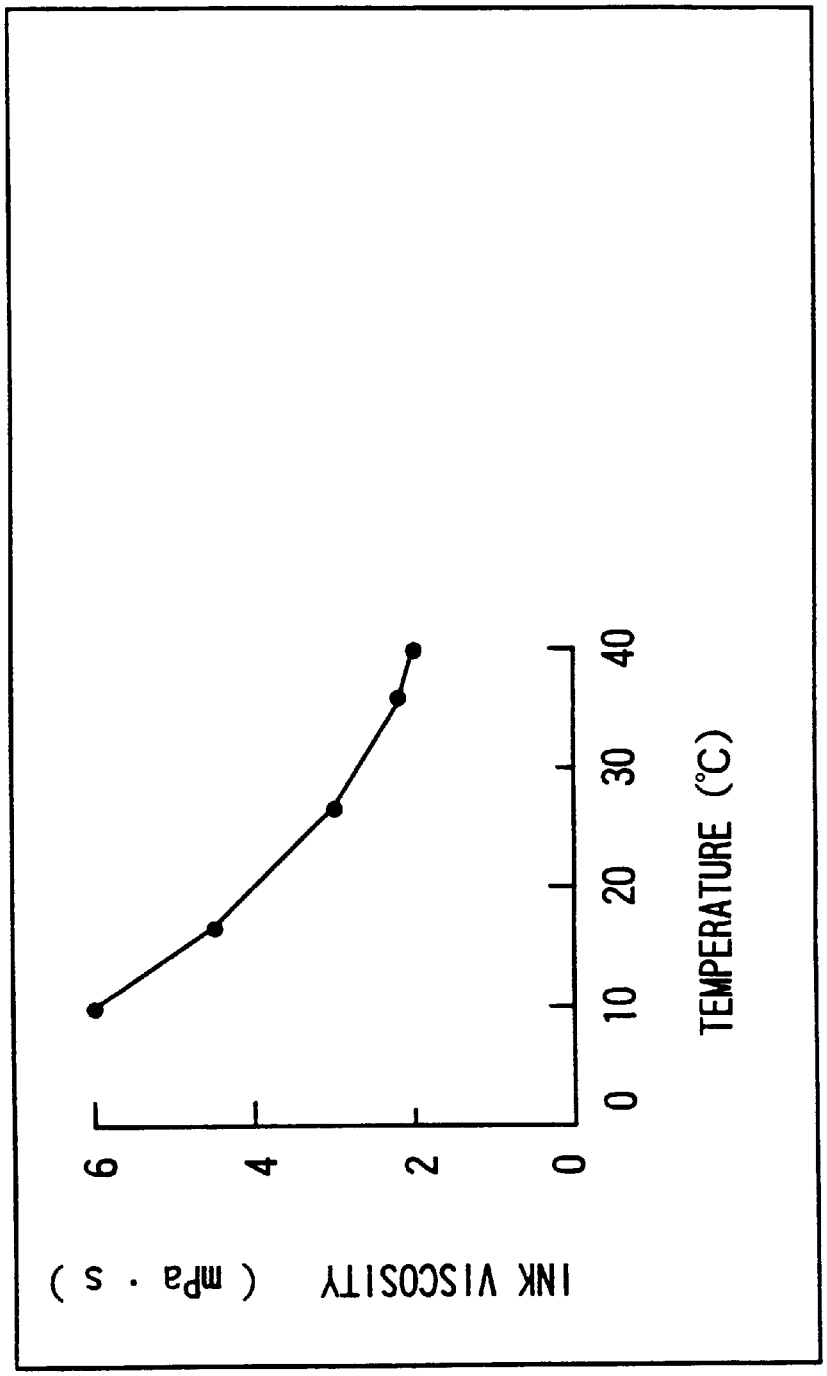

One example of specific measurements of such an ink ejection apparatus 600 is one having ink flow paths 613 with a length L of 7.5 mm; and nozzles 618 with a diameter of 35 μm on the ink ejection side, a diameter of 72 μm on the ink flow path 613 side and a length of 100 μm. In addition, the viscosity of ink used in the experiments has the characteristic illustrated in FIG. 4. The ratio L/a (=T) of the above-described length L to the speed of sound "a" in the ink within the ink flow path 613 is 12 μsec.

Figure 3:
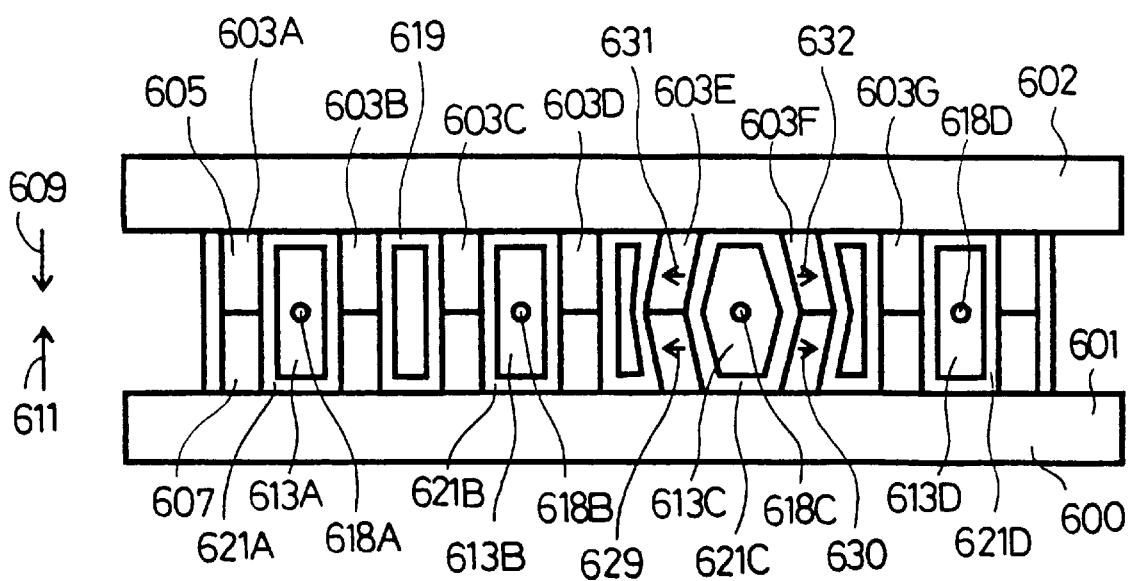
FIG. 3 shows the operation of the ink ejection apparatus of a conventional example and the invention; and, FIG. 4 is a graph showing changes in the viscosity of the ink with changes in temperature.

In addition, each actuator wall 603 undergoes a piezoelectric thickness deformation in the direction which increases the volume of the ink flow paths 613, through the silicon chip 625 impressing a voltage on the electrode 621 of each ink flow path 613. For example, as shown in FIG. 3, when the voltage V is impressed on the ink flow path 613C, an electric field is created in actuator wall 603E in the direction of arrows 629,631 and in wall 603F in the direction of arrows 630,632, so that actuator walls 603E,603F undergo a piezoelectric thickness deformation in the direction which increases the volume of the ink flow path 613C. Further, when precisely the time T has elapsed from the impressing of this voltage, the pressure inside the ink flow path 613 reverses and switches to a positive pressure. However, in accordance with this timing, the voltage impressed on the electrode 621C of the ink flow path 613C is returned to 0. When this occurs, the actuator walls 603E,603F return to the state prior to deformation (FIG. 2A), and a pressure is applied to the ink. At this time, the pressure wave which has turned positive and the pressure created by the actuator walls 603E,603F returning to the pre-deformation state add together, so that a relatively high pressure is created in the area near the nozzle 618C of the ink flow path 613C, causing ink to be ejected from the nozzle 618C.

An ink ejection test was conducted with the ink ejection apparatuses 600 of the present embodiment in which the rate of change of the electromechanical coupling coefficient with changes in temperature differed at temperatures not greater than 20° C. The various ink ejection devices 600 were driven at a driving voltage such that the ejection velocity of the ink drops was 5 m/s at 25° C., and the ejection velocity of the ink drops was measured when these apparatuses were driven with the same driving voltages at 10° C. The results are shown in FIG. 1. Here, "x" indicates cases where ejection was impossible. Because it is necessary to have a minimum ink drop ejection velocity of at least 3 m/s in order to obtain good printing quality, the rate of change of the electromechanical coupling coefficient with changes in temperature needs to be 3000 PPm/°C. or less at temperatures of 20° C. or less. In particular, when the rate of change is 1000 PPm/°C. or less and the temperature is 20° C. or less, the ejection velocity is approximately 3.9 m/s or greater, and when the rate of change is 0 PPm/°C. or less, there is substantially no change in the ejection velocity of the ink drops with increases in the viscosity of the ink, which is more effective.

The ink was caused to be ejected by increasing the volume of the ink flow paths 613 and supplying ink to the ink flow paths 613, after which the ink flow paths 613 returned to the original state, but even in the case where the ink is caused to be ejected by first causing the volume of the ink flow paths to decrease (resulting in ejection) followed by the ink flow paths 613 returning to the normal state and ink being supplied into the ink flow paths 613, the results of the above-described ink ejection test were the same as the results shown in FIG. 1.

As described above, with the ink jet head of the present embodiment, the rate of change of the actuator wall 603 with changes in temperature is not greater than 3000 PPm/°C. at temperatures of 20° C. or less, and consequently, at a driving voltage that produces an ink drop ejection velocity of 5 m/s at 25° C., the ink drop ejection velocity when driven at 10° C. is at least 3 m/s, so that it is possible to obtain good printing quality regardless of changes in temperature. In addition, because it is not necessary to adjust the ink drop ejection speed by causing the driving voltage of the ink ejection apparatus 600 to change in accordance with changes in the temperature around the ink ejection apparatus as was the case conventionally, the driving circuit becomes less expensive, making it possible to reduce costs.

In particular, when the rate of change of the actuator wall 603 with changes in temperature is 0 PPm/°C. or less, at a driving voltage that produces an ink drop ejection velocity of 5 m/s at 25° C., there is substantially no drop in the ink drop ejection velocity under driving at 10° C., making it possible to conduct high quality recording.

The preferred embodiment of the invention was described in detail above, but this is intended to be illustrative and not limiting. For example, in the above-described embodiment, shearing mode piezoelectric ceramics were used, but the invention can also be applied to ink ejecting apparatuses (for example, Kyser types) which use horizontal and vertical direct modes. In addition, in other configurations, the invention can be enacted with various modified and improved forms by those skilled in the art.

In the present embodiment, air chambers 615 were provided between the ink flow paths 613, but the invention also applies to an ink ejection apparatus without air chambers.

In addition, in the present embodiment, the top and bottom parts of the actuator walls 603 both underwent piezoelectric deformation, but it is acceptable for only the top part or only the bottom part of the actuator walls of the ink ejection apparatus to undergo piezoelectric deformation.

What is claimed is:

1. A shearing mode type ink ejection apparatus, comprising:

a first plate;

a second plate;

a plurality of parallel walls extending from the first plate and connected to the second plate, the plurality of walls defining a plurality of chambers, a chamber defined between each pair of adjacent walls of the plurality of walls;

a nozzle plate mounted at one end of the plurality of chambers, the nozzle plate having a nozzle for at least every other chamber of the plurality of chambers;

a manifold for feeding ink to each chamber having a nozzle, the manifold positioned at an opposite end of the plurality of chambers; and means for causing selected walls to flex to eject ink droplets, wherein the walls are formed from a piezoelectric material and have a rate of change of an electromechanical coupling coefficient of 3000 PPm/°C. or less when a change of temperature occurs at a temperature of 20° C. or less that ensures an effective shear mode operation of said selected walls.

2. The ink ejection device as claimed in claim 1, wherein the rate of change of the electromechanical coupling coefficient of the walls with changes in temperature at temperatures of 20° C. or less is 0 PPm/°C. or less.

3. The ink ejection device as claimed in claim 1, wherein the piezoelectric material is lead zirconate titanate (PZT).

4. The ink ejection device as claimed in claim 1, wherein the rate of change of the electromechanical coupling coefficient of the walls with changes in temperature at temperatures of 20° C. or less is 1000 PPm/°C. or less.

* * * * *